455-296 SR
FIP8106 XR 3,558,917
TX 5432E

United States Patent [11] 3,558,917

CROSS REFERENCE

[72] Inventor William G. Crouse
Raleigh, N.C.
[21] Appl. No. 723,763
[22] Filed Apr. 24, 1968
[45] Patented Jan. 26, 1971
[73] Assignee International Business Machines Corporation
Armonk, N.Y.
a corporation of New York

[54] THRESHOLD AMPLITUDE DETECTOR ELIMINATING LOW-LEVEL NOISE EMPLOYING THRESHOLD-BIASED INTERRUPTABLE FEEDBACK FOR PROVIDING LIMITED RANGE HIGH-GAIN AMPLIFIER OPERATION
8 Claims, 7 Drawing Figs.

[52] U.S. Cl. .......... 307/235, 307/237, 307/285; 328/115, 328/150, 328/169, 330/26, 330/86; 325/473
[51] Int. Cl. .......... H03f 1/34
[50] Field of Search .......... 307/235, 237, 285; 328/150, 169, 115, 116; 325/478; 330/26(Inquired), 86(Inquired), AU 252

[56] References Cited
UNITED STATES PATENTS

| | | | |
|---|---|---|---|
| 3,060,382 | 10/1962 | Huntley | 328/69X |
| 2,961,552 | 11/1960 | Andresen | 307/237X |
| 3,041,535 | 6/1962 | Cohran | 307/237X |
| 3,058,068 | 10/1962 | Hinrichs | 307/237X |
| 3,177,377 | 4/1965 | Brown | 307/235 |
| 3,213,293 | 10/1965 | Finlon et al. | 307/235 |
| 3,248,569 | 5/1966 | Weekes | 307/237 |

*Primary Examiner*—John S. Heyman
*Attorneys*—Hanifin and Jancin and John C. Black

ABSTRACT: An improved threshold detector includes a high gain amplifier with negative feedback means and a Schmitt trigger coupled to the output of the amplifier. The feedback means includes semiconductor devices normally biased to cause (1) low gain amplification of input signal levels below a first input current threshold, (2) high gain amplification of input signal levels between the first threshold and a second, higher threshold, and (3) low gain amplification of input signal levels above the second threshold. The Schmitt trigger responds to positive and negative amplifier output signal levels in the high gain region for switching back and forth between its two stable states. The detector exhibits a significant improvement in signal/noise discrimination in a communications environment.

3558917
OR IN 307/360

PATENTED JAN 26 1971
3,558,917
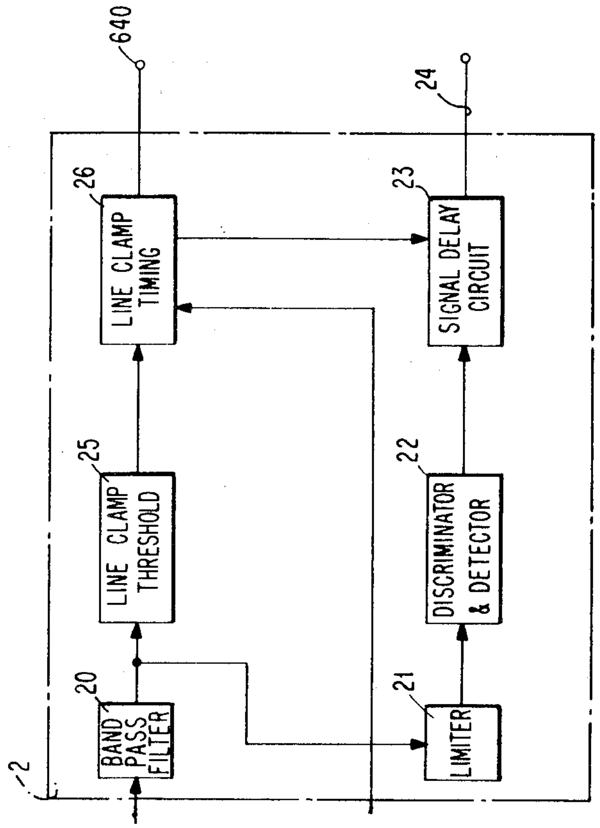
*INVENTOR*
WILLIAM G. CROUSE
BY John C. Black
*ATTORNEY*

THRESHOLD AMPLITUDE DETECTOR ELIMINATING LOW-LEVEL NOISE EMPLOYING THRESHOLD-BIASED INTERRUPTABLE FEEDBACK FOR PROVIDING LIMITED RANGE HIGH-GAIN AMPLIFIER OPERATION

This application is directed generally to improved transmitting and receiving apparatus of the type utilizing frequency shift keying techniques.

This application is a division of copending application of William G. Crouse, the inventor herein, Ser. No. 448,521, filed April 15, 1965, now U.S. Pat. No. 3,432,616.

In apparatus of this type, many serious problems have been encountered, some of which have not been solved without resorting to extremely expensive circuits.

One problem which has existed is that of designing apparatus which can reliably distinguish between noise and data signals with signal-to-noise ratios closely approximating unity.

Accordingly, it is a primary object of the present invention to provide an improved threshold circuit which reliably distinguishes between signals which are at or a very small amount below a predetermined threshold.

The latter object is achieved in a preferred embodiment of the invention by means of a shunt feedback amplifier wherein the shunt feedback circuit includes nonlinear elements such as diodes, which provide extremely high amplifier gain only in a small precisely defined region between two adjacent regions of low gain. The threshold is set within the region of high gain to provide a very high degree of discrimination between signal levels below and above the threshold.

In addition, the preferred embodiment includes a bistable Schmitt trigger having a hysteresis characteristic, the hysteresis thresholds being exceeded only by output signals from the shunt feedback amplifiers which have entered the high gain region and reach the threshold level therein.

The foregoing and other objects, features and advantages of the invention will be apparent from the following more particular description of preferred embodiments of the invention, as illustrated in the accompanying drawings.

FIG. 1 is a diagrammatic view of receiving apparatus incorporating the improved threshold detector of the present application;

FIGS. *2a* and *2b* are a schematic diagram of a preferred form of the improved threshold detector;

Figure 2A:
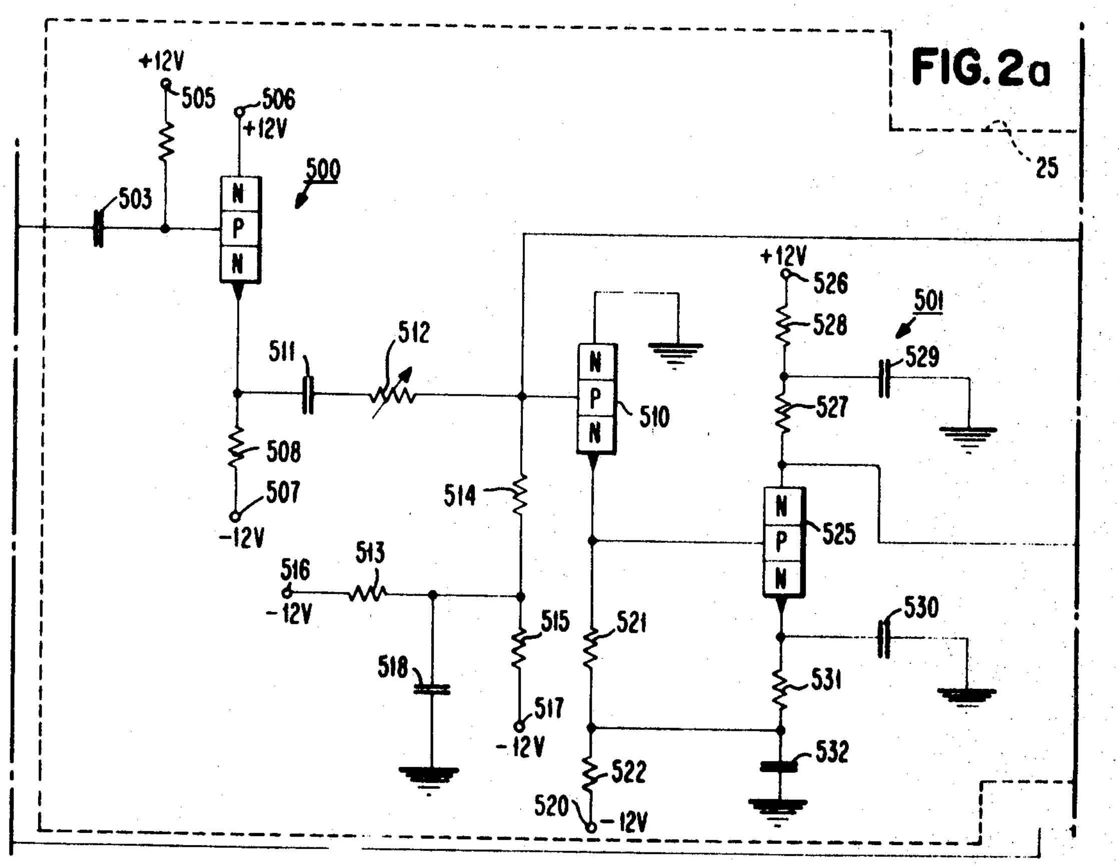

The receiving unit 2 of FIG. 1 includes a band-pass filter 20 which substantially attenuates noise signals having frequencies substantially above and below the two data transmitting frequencies. The output of the band-pass filter is connected to a limiter 21 which provides very high gain to low amplitude signals and substantially limits the amplitude of relatively high amplitude signals. By reason of the very high gain in the limiter and the limiting action therein, only the strongest signal is passed through the limiter. During the reception of data, the data signals are almost invariably the strongest signals present, whereby the data signals pass through the limiter and noise signals are substantially eliminated.

The output of the limiter 21 is applied to a frequency discriminator and detector circuit 22. The circuit 22 responds to data signals in the form of an alternating current carrier at one or the other of the two frequencies to produce a direct current output voltage which is at one or the other of two voltage levels representative of a logical 1 or a logical 0 data bit.

The output of the frequency discriminator 22 is applied to a time delay circuit 23, the output 24 of which is alternatively at one or the other of two voltage levels representative of a logic 1 or a logic 0 data bit, to couple data from the frequency discriminator and detector circuit 22 to the data processing apparatus.

However, in the course of coupling the data from the circuit 22 to the data processing apparatus, the circuit 23 delays the transmission of the data for a predetermined time interval. This delay is required because the limiter 21 has such a high gain at very low input amplitudes that it is capable of amplifying signals, which were substantially attenuated by the filter 20, to the point where they occasionally could be as data signals. This can occur only when data signals are not present.

Hence, means must be provided to determine whether the signals represent data or noise; and, in the event that no data is present, this means must prevent the output of the discriminator and detector circuit 22 from being applied to the output line 24. Hence, the delay circuit 23 provides a time delay to permit the determination of the presence or absence of data.

More specifically, the output of the band-pass filter 20 is coupled to a line clamp threshold circuit 25 which determines whether incoming signals received by the driver-terminator 6 and passing through the band-pass filter 20 are of sufficient amplitude to be recognized as data pulses.

In the specific embodiment, the amplitude at which the decision is made that the signal is data is extremely accurate and precise. The circuit 25 is designed such that the signal-to-noise ratio can be very close to 1 with reliable discrimination between noise and data. The input circuit to the line clamp threshold is preset for a precise threshold value with assurance that signals, which are a very small increment below the threshold will be rejected as noise; and signals which are an insignificant increment above the threshold will be accepted as data.

The output of the line clamp threshold circuit 25 is coupled to a line clamp timing circuit 26 which together with the circuit 25 controls the output of the timing circuit 23 so as to force the output 24 to a logic 1 level when data is not present, thereby preventing the transmission of erroneous data to the data processing apparatus.

Input signals, whether they represent data or noise, are applied to the band-pass filter 20. Although those noise signals which are higher and lower in frequency then the data signal frequencies are substantially attenuated by the band-pass filter 20, nevertheless, the limiter circuit 21 has such a high gain at low level signals that it is possible in many instances for the attenuated noise signals to be amplified to the extent that they appear in amplitude substantially equal to the amplitude of data signals at the output of the limiter 21.

Thus, means must be provided to prevent such signals from being transmitted over the output line 24 to the associated data processing apparatus. These means are provided in the form of two circuits which perform two different functions.

The first function, which is provided by the line clamp threshold circuit 25, establishes a highly accurate threshold level; and signal amplitudes, which are a very small amount less than the threshold will be rejected by the threshold circuit; and the output line 24 will be clamped at the logical 1 level. Input signals at and above the threshold will be accepted by the threshold circuit; but, since some of these signals may not be data signals, additional discriminating means must be provided to clamp the line 24.

It will be seen below that the threshold of the circuit 25 is the composite of two individually selectable thresholds, one an amplifier high gain threshold and the other a trigger input threshold.

This second function is provided by the line clamp timing circuit 26 which detects short duration noise signals which are of sufficient amplitude to be accepted by the line clamp threshold circuit; and, when the timing circuit determines that the signals are noise rather than data, it causes the output line 24 to be clamped at the logical 1 level.

Thus noise is rejected if its amplitude is sufficiently low to be rejected by the line clamp threshold circuit 25 or if its time duration is so short relative to the time duration of typical data signals as to be rejected by the line clamp timing circuit 26.

The line clamp threshold circuit 25 includes an isolating emitter follower 500 operated in the linear portion of its characteristic, an amplifier 501 with nonlinear shunt feedback and a Schmitt trigger 502. The emitter follower 500 is coupled to the output of the band-pass filter 20 by means of a coupling capacitor 503. A resistor 504 connected to the base electrode of the emitter follower 500 and to a positive bias supply terminal 505 causes the operation of the emitter follower at a selected level. The collector electrode of the emitter follower 500 is connected to a positive supply terminal 506, and the emitter electrode is connected to a negative supply terminal 507 by means of a resistor 508.

The emitter electrode is coupled to the base electrode of a transistor 510 of the amplifier 501 by means of a low impedance coupling circuit including a series-connected capacitor 511 and a resistor 512. The resistor 512 is shown as a variable resistance for the purpose of illustrating the fact that the input threshold for the amplifier 501 may be set manually to a desired value by adjusting the value of the resistor 512. It will be appreciated, however, that in a particular commercial embodiment, that a fixed resistor of a selected value will frequently be used.

A bias circuit comprising the resistors 513, 514, 515 is connected to the base electrode, the resistors 513 and 515 being connected to positive and negative supply terminals 516 and 517. A capacitor 518 connects the junction between the resistors 513 and 515 to ground potential. The capacitor 518 and the resistor 514 serve the additional function of filtering the supply potential ripple.

The collector electrode of the transistor 510 is connected to ground potential; and its emitter electrode is connected to a negative supply terminal 520 by means of resistors 521 and 522.

The emitter electrode of the transistor 510 is also connected to the base electrode of a second transistor 525 of the amplifier 501. The collector electrode of the transistor 525 is connected to a positive supply terminal 526 by means of resistors 527 and 528. The junction between the resistors 527 and 528 is connected to ground potential by means of a capacitor 529. The emitter electrode of the transistor 525 is connected to ground potential by means of a capacitor 530 and is also connected to ground potential by means of a resistor 531 and a capacitor 532. The resistors 522 and 528 and the capacitors 532 and 529 serve as supply filters. The resistor 531 and the capacitor 530 serve the function of stabilizing the operation of the transistor 525.

The collector electrode of the transistor 525 is connected to a nonlinear capacitive shunt feedback circuit 540 which includes a pair of capacitors 541 and 542 and diodes 543 to 548 inclusive. A bias supply circuit for the diodes includes a positive supply terminal 550, a resistor 551, resistors 552 and 553 and negative supply terminals 554 and 555. The voltage levels of the supply terminals 550, 554 and 555 and the values of the resistors 551, 552 and 553 are selected so that the diodes 546 and 545 are normally forward biased to a predetermined level.

The bias current in diodes 545 and 546 times the value of the resistor 512 determines the peak threshold voltages of the circuit since, when the current in resistor 512 is equal to the initial bias current in either diode 545 or 546, the current in that diode will go to zero and the gain of the shunt feedback amplifier 501 will become quite high.

With the diodes 546 and 545 forward biased, the shunt feedback path impedance is essentially the low impedance of the series-connected capacitors and diodes 541, 542, 545 and 564. The diodes 543, 544 and 547, 548, which are in parallel with the diodes 545 and 546, are normally in their high impedance states. As will be seen in more detail below, input signals from the emitter follower 500 will cause the voltage-current characteristics (and therefore the impedance) of the diodes 546 to 548 to be significantly altered, thereby varying the amount of shunt feedback and the gain of the amplifier 501.

The output signals from the amplifier 501 are applied by capacitor 559 to the base electrode of a transistor 560 which, together with a second transistor 561, form the Schmitt trigger 502. The emitter electrodes of the transistors 560 and 561 are connected to a negative supply terminal 562 by means of a common emitter resistor 563. The collector electrodes of the transistors 560 and 561 are connected to positive supply terminals 564 and 565 by means of resistors 566 and 567. Base bias supplies for the transistors 560 and 561 are provided by resistors 568 and 569 which are connected between a positive supply terminal 570 and ground potential and by resistors 571 and 572 which are connected between the collector electrode of the transistor 560 and ground potential.

The Schmitt trigger is stable in either of two operating states, one of which exists when the transistor 560 is conducting and transistor 561 is nonconducting and the other of which exists when the transistor 560 is nonconducting and the transistor 561 is conducting. As is well known in the art, Schmitt triggers are characterized by a hysteresis characteristic whereby, in order to switch the trigger from one state to the other, the input signals must exceed minimum values above and below a predetermined average bias value.

Since the trigger 502 is coupled to the amplifier by means of a capacitor 559, an input signal of a predetermined positive amplitude will turn the transistor 560 on and an input signal of a predetermined negative value will turn the transistor 560 off. When the transistor 560 is switched from one state to another in response to an input signal, it in turn switches the transistor 561 to its opposite state of conduction.

The threshold for switching the trigger is fixed so as to lie between the voltage level at the collector electrode of the transistor 525 which causes the diode 545 or 546 to be substantially nonconducting and the voltage level which causes the diodes 543, 544 or 547, 548 to enter their low impedance regions.

The operation of the amplifier 501 and the shunt feedback circuit including the diodes will be explained more fully with respect to FIGS. 3 and 4. For the present, it is sufficient to note that, as the input signal to the amplifier 501 initially increases positively to drive the voltage more negative at the junction between the capacitors 541 and 559, feedback current begins to flow through the capacitors 541 and 542 and the diodes 546 and 545. Due to the low impedance of the diodes, the gain is low.

As the amplitude of the input signal increases further, the impedance of the diode 545 does not change significantly since it is being driven further into its low impedance region, whereas the impedance of the diode 546 begins to rise as it becomes forward biased to a lesser degree. As the input signal level reaches a selected threshold, the impedance of the diode 546 reaches a high value relative to the input impedance 512 such that very slight additional increases in input signals produce very high increases in the output voltage of the amplifier 501; i.e., the amplifier has a very high gain characteristic. This amplifier threshold can be properly referred to as a high gain threshold.

It can be seen that the amplifier 501 in combination with the Schmitt trigger 502 provides an unusually effective discriminator between noise and signal levels. In the preferred embodiment, it is possible to have a signal-to-noise ratio which is almost equal to one (e.g., 95) and still discriminate with a high degree of accuracy between the noise level and the defined signal level. The exact composite threshold level at which signals are accepted can be determined by the value of the resistor 512 at the input to the amplifier 501. It will be appreciated, of course, that this resistor value is set after the initial bias current levels of the diodes 545 and 546 and the hysteresis characteristics of the trigger 502 are fixed.

It will be appreciated therefore that, for each positive and negative swing in voltage at the output of the amplifier 501 which is above the composite threshold level, the collector electrode of the transistor 560 will switch instantaneously negative and positive to produce a square wave output.

Similar square wave output signals will appear at the collector electrode of the transistor 561. However, these will be 180° out of phase with respect to the output signals from the transistor 560.

At this time, very little current passes through the shunt feedback circuit.

Once the threshold level is reliably exceeded, it becomes desirable to prevent saturation or cutoff of the amplifier to reduce the gain and limit the output signal. At a somewhat higher input signal level than that at which the diode 546 enters a relatively high impedance region, the diodes 547 and 548 become substantially forward biased to their low impedance regions relative to the input impedance 512. A low impedance shunt feedback path is again established through the capacitors 541 and 542 and the diodes 548, 547 and 545 inclusive.

The diodes 543, 544 and 545 act in a similar manner to provide low gain amplification of the negative half cycles of the input signal to the amplifier 501 which are below the threshold level and very high gain at and above the threshold level until the limiting action is achieved.

In the preferred embodiment, the Schmitt trigger threshold is selected at some point intermediate the ends of each high gain region of the amplifier 501; i.e., higher than the threshold of the amplifier 501.

Input signals which do not produce output signals which exceed this high gain threshold are insufficient to switch the Schmitt trigger 502. It is only when the trigger 502 is switched from one state to another that the threshold circuit 25 is effective to prevent line clamping, and this results only when the input signal level to the amplifier 501 is of sufficient amplitude.

In some applications, the nonlinear feedback amplifier may provide suitable output signals so that no Schmitt trigger would be required.

Certain of the component values for FIG. 2*a* and *b* is set forth below by way of example; however, other suitable values may be selected by those skilled in the art:

RESISTORS IN OHMS

| | |
|---|---|
| **352, 362, 372** | **3,300** |
| **420** | **120** |
| **434** | **3,900** |
| **512** | **1,580 —4,580** |
| **513** | **43,000** |
| **515** | **20,000** |
| **521** | **5,600** |
| **528** | **200** |
| **531** | **1,600** |
| **551** | **412,000** |
| **552,553** | **590,000** |
| **556,567** | **6,800** |
| **568** | **34,800** |
| **569** | **2,430** |
| **571** | **24,000** |
| **572** | **3,600** |

CAPACITORS

| | |
|---|---|
| **541,542** | **18** microfarad |
| **529,530,532** | **68** microfarad |
| **518** | **27** microfarad |

Figure 2B:
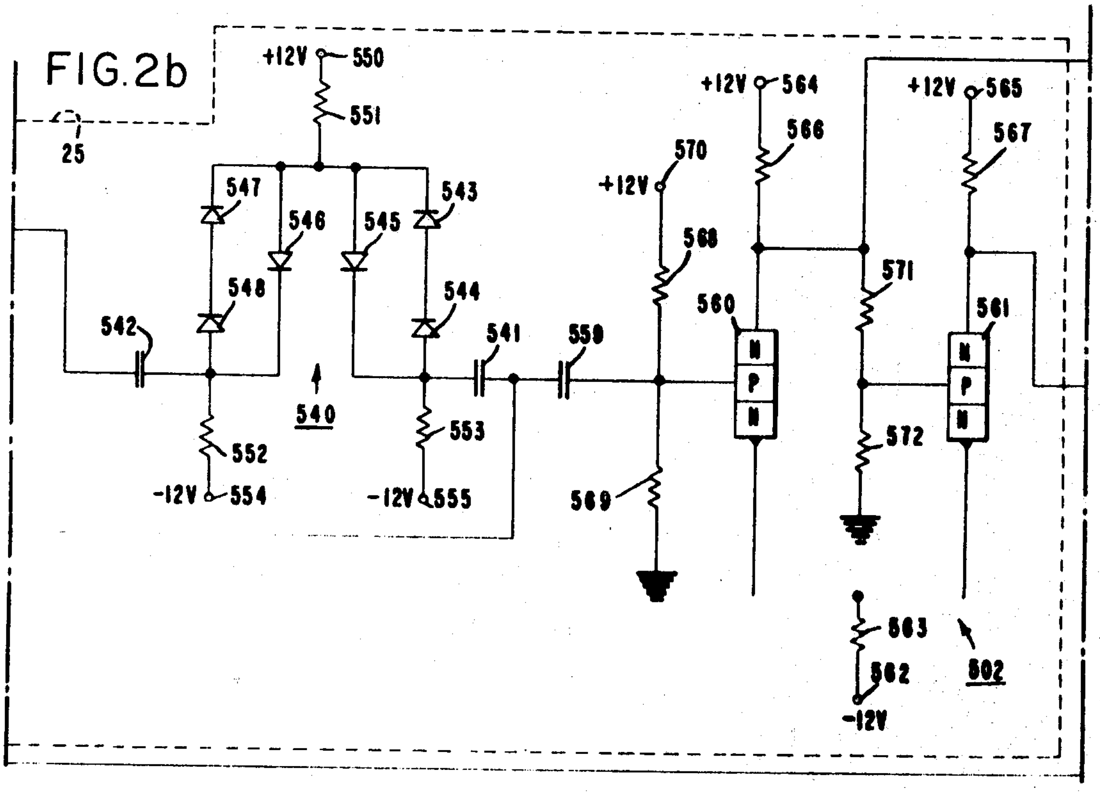
Figures 3, 4:
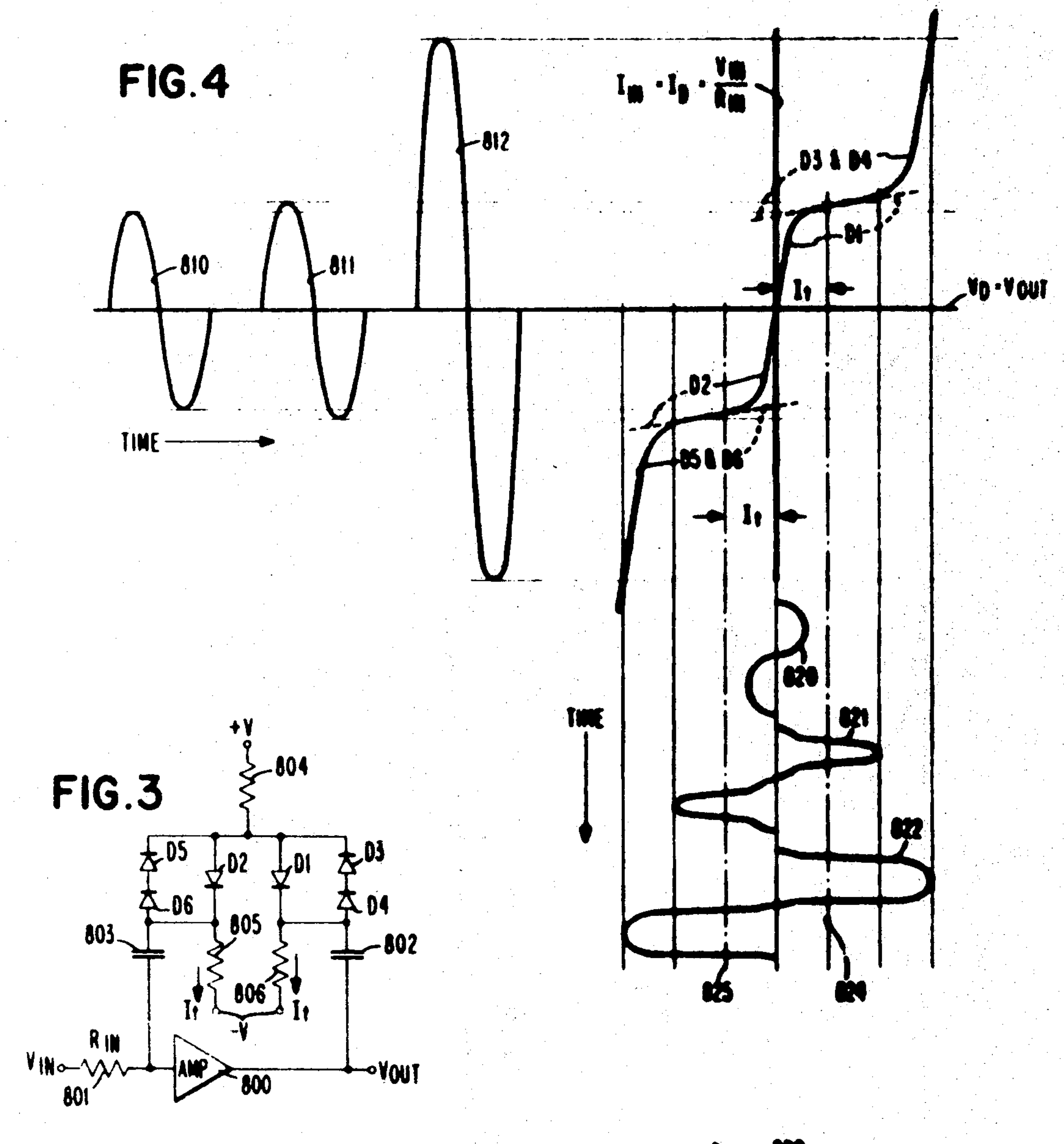
FIG. 3 is a diagram partially schematic and partially diagrammatic illustrating the improved nonlinear shunt feedback circuit of the present application.
FIG. 4 is a graph illustrating the diode characteristics of the improved nonlinear shunt feedback amplifier together with the operating characteristics of the amplifier.

FIG. 4 is a graph illustrating the diode-feedback-gain characteristics of the line clamp threshold circuit 25 of FIGS. 2*a* and 2*b*.

FIG. 3 illustrates partly in schematic form and partly in diagrammatic form the nonlinear shunt feedback amplifier of FIGS. 2*a* and 2*b* in its broadest sense for ease of explanation of the curves of FIG. 4.

Thus FIG. 3 includes an amplifier 800 having an input resistor 801 and a shunt feedback circuit including a pair of capacitors 802 and 803 and a plurality of diodes D1—D6, inclusive. Resistors 804, 805 and 806 are connected to positive and negative supply terminals to provide equal bias currents $I_t$ normally forward biasing the diodes D1 and D2 as to their low impedance regions, as illustrated in FIG. 4, at the zero input current, zero output voltage crossover point. The diodes D3—D6, inclusive, are normally reverse biased.

For purposes of illustration, three input waveforms 810, 811 and 812 are illustrated. The maximum positive and negative current levels of the input signal 810 are a very small amount less than the bias currents $I_t$ of the diodes D1 and D2. The maximum positive and negative current levels of the waveform 811 are slightly in excess of the bias currents $I_t$. The maximum positive and negative values of the input current of the waveform 812 greatly exceed the bias currents $I_t$.

The Schmitt trigger threshold is reached when the input signal level is equal and opposite to one of the diode bias currents $I_t$ to cause zero current flow in the diode.

The level of the input signal 810 is below the threshold current $I_t$ and will therefore be rejected as noise, the amplitudes of the signals 811 and 812 exceed the threshold current $I_t$ and will therefore be accepted as data.

The input signals 810, 811 and 812 will produce output signals 820, 821 and 822, respectively. It can be seen that, since the maximum current levels of the signal 810 do not reach the threshold levels $I_t$, the diodes D1 and D2 do not achieve zero current conditions; and the gain of the stage is limited.

It can be seen that, when the level of the current of the input signal 811 becomes substantially equal to the threshold currents $I_t$, the output signal amplitude of the waveform 821 immediately rises to a much higher value since the current in the diodes D1 and D2 is approximately zero, whereby the feedback current is approximately zero and the gain of the amplifier is very high.

Since the maximum current levels of the input signal 812 are substantially greater than the threshold current $I_t$, they forward bias the diodes D5 and D6 during the positive half cycle and the diodes D3 and D4 during the negative half cycle to provide a limiting action in the amplifier by reason of the increase in feedback current and the consequent decrease in gain. This limiting action is not required for the threshold function; however, since data signals can vary over a range of fifty to one or more, limiting becomes necessary.

It will be recalled that a Schmitt trigger 502 is provided in the preferred embodiment of FIGS. 2*a* and 2*b* to respond to output signals from the shunt feedback amplifier. The input thresholds of the Schmitt trigger hysteresis characteristic are set within the high gain region of the amplifier, preferably at the levels illustrated by the broken lines 824 and 825; i.e., where the input current levels equal the diode bias levels $I_t$.

In the embodiment of FIGS. 2*a* and 2*b*, the threshold $I_t$ can be set with sufficient accuracy and the gain of the amplifier can be made sufficiently high so that very high signal-to-noise ratios can be tolerated, for example, in the order of twenty to nineteen. It will be noted that this data signal level of twenty is the lowest acceptable data level and that data having levels fifty or more times as great will be received.

Figure 5:
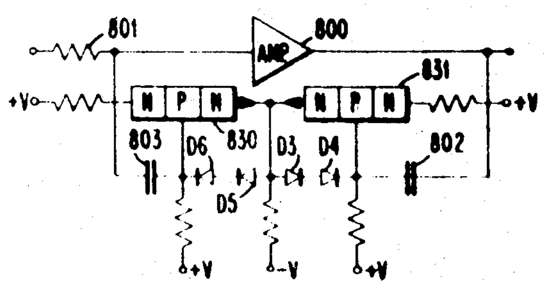
FIGS. 5 and 6 are alternative embodiments of the improved nonlinear shunt feedback amplifier of the present application.

FIGS. 4 and 5 show alternative embodiments of the nonlinear shunt feedback amplifier of FIG. 3. In FIG. 4 a pair of transistor amplifiers 830 and 831, normally operated in the region of saturation, can be used to replace the diodes D1 and D2. The current—voltage characteristics of the base-emitter junctions of the amplifiers 830 and 831, described more fully in U.S. Pat. No. 3,382,378 to Akmenkalns, provide the nonlinear feedback functions; and they can be used to provide greater signal-to-noise discrimination. Other components in the embodiment of FIG. 5 which correspond to components in FIG. 3 have been assigned similar reference numerals.

Figure 6:
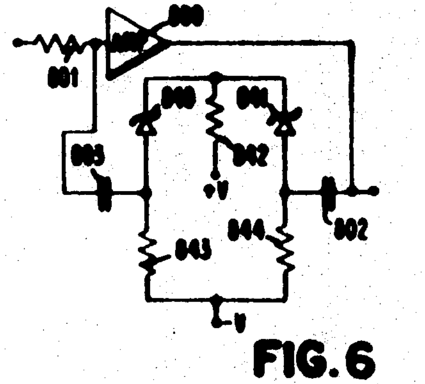

FIG. 6 illustrates a third embodiment of the shunt feedback amplifier of FIG. 9. In this embodiment, the diodes D1—D6, inclusive, are replaced by a pair of Zener diodes 840 and 841. Since each Zener diode has two well-defined low impedance regions separated by a region of high impedance, each Zener diode fulfills the function of three of the diodes, such as D1, D3 and D4 of FIG. 3. Preferably, the Zener diodes are biased to their reverse breakdown low impedance regions by means of resistors 842, 843 and 844 which are connected between positive and negative power supplies. Components in the embodiment of FIG. 6 which correspond to similar components in FIG. 3 have been assigned similar reference numerals.

Since many Zener diodes have very sharp break points between their high and low impedance regions at the reverse breakdown level, it is possible to achieve an even greater signal-to-noise discrimination than is possible in the embodiment of FIG. 3. For example, with particular reference to FIG. 4, if the characteristic curve starting from the zero input current—zero output voltage intersection is linear or substantially linear until the threshold $I_t$ is reached and then the characteristic becomes almost completely horizontal. It will be possible to accurately discriminate between input signal levels which have maximum amplitudes which are substantially closer to each other than those of input signals 810 and 811.

While the invention has been particularly shown and described with reference to preferred embodiments thereof, it will be understood by those skilled in the art that the foregoing and other changes in form and details may be made therein without departing from the spirit and scope of the invention.

I claim:

1. In apparatus of the type wherein means are provided for receiving signals representative of data and noise, wherein the difference between the minimum amplitude of the data signals and the amplitude of a significant amount of noise signals is a small fraction of the minimum data signal amplitude and wherein maximum data signal amplitudes are a large multiple of the minimum data signal amplitudes, the combination with said means of a threshold detector circuit for discriminating between the data signals and the noise signals, said circuit comprising a high gain transistor amplifier;

a shunt negative feedback circuit for said amplifier including series-connected, oppositely poled base-emitter junctions of a pair of transistors of the same conductivity type normally biased to saturation providing substantial negative feedback for operating the amplifier at a low gain level, and responsive to alternating current input signal levels substantially at a predetermined threshold level for changing the impedance of one of the base-emitter junctions to a high impedance region substantially interrupting the negative feedback to increase the gain of the amplifier substantially to its maximum region; and a bistable Schmitt trigger with first and second states, having a hysteresis characteristic and responsive only to positive and negative output signals from the shunt feedback amplifier which are not less than a predetermined level in the maximum gain region of the amplifier to switch to said first and second states respectively.

2. In apparatus of the type wherein means are provided for receiving signals representative of data and noise, wherein the difference between the minimum amplitude of the data signals and the amplitude of a significant amount of noise signals is a small fraction of the minimum data signal amplitude and wherein maximum data signal amplitudes are a large multiple of the minimum data signal amplitudes, the combination with said means of a threshold detector circuit for discriminating between the data signals and the noise signals, said circuit comprising an alternating current coupled high gain transistor amplifier, a capacitively coupled shunt negative feedback path for said amplifier including semiconductor means normally biased to a low impedance state providing substantial negative feedback to operate the amplifier in a low gain region, responsive to positive and negative input signal levels of a predetermined minimum value to substantially interrupt the negative feedback for increasing the gain of the amplifier substantially from its low gain region to a high gain region and responsive to positive and negative input signal levels of a higher predetermined value to reestablish substantial negative feedback for reducing the gain of the transistor amplifier from its high gain region to its low gain region, and a bistable Schmitt trigger with first and second states, having a hysteresis characteristic and responsive only to positive and negative output signals from the shunt feedback amplifier which are not less than a predetermined level in the high gain region of the amplifier to switch to said first and second states respectively.

3. In apparatus of the type wherein means are provided for receiving signals representative of data and noise, wherein the difference between the minimum amplitude if the data signals and the amplitude of a significant amount of noise signals is a small fraction of the minimum data signal amplitude and wherein maximum data signal amplitudes are a large multiple of the minimum data signal amplitudes:

the combination with said means of a threshold detector circuit for discriminating between the data signals and the noise signals, said circuit comprising a high gain transistor amplifier;

a shunt negative feedback circuit for said amplifier including first semiconductor means normally biased to a low impedance state providing substantial negative feedback to operate the amplifier at a low gain level, and responsive to alternating current input signal levels substantially at a predetermined threshold level for changing the impedance of the semiconductor means from the low impedance state to a high impedance state to increase the gain of the amplifier substantially to its maximum level, and second semiconductor means normally biased to a high impedance state and responsive to input signal levels substantially higher than said threshold level for changing the impedance of the second semiconductor means to a low impedance state to reduce the gain of the amplifier; and a bistable Schmitt trigger with first and second states, having a hysteresis characteristic and responsive only to positive and negative output signals from the shunt feedback amplifier which are not less than a predetermined level in the high gain region of the amplifier to switch to said first and second states respectively.

4. A variable gain circuit comprising a high gain transistor amplifier; and a shunt feedback circuit for said amplifier including a first pair of series-connected similarly poled diodes and a second pair of series-connected diodes poled opposite to the first pair of diodes, third and fourth diodes, each connected in parallel with and of opposite polarity to a respective one of the pairs of diodes, means normally biasing the third and fourth diodes to their low impedance regions providing substantial negative feedback to operate the amplifier at a low gain level, said third and fourth diodes responsive to positive and negative alternating current input signal levels substantially at a predetermined threshold level for operating one of the diodes in its high impedance region substantially interrupting the negative feedback to increase the gain of the amplifier substantially to its maximum level, and said first and second pairs of diodes responsive to each input signal level substantially higher than said threshold level for operating one of the pairs of diodes in their low impedance regions substantially increasing the negative feedback to reduce the gain of the amplifier.

5. The variable gain circuit of claim 4 further comprising a bistable Schmitt trigger with first and second states, having a hysteresis characteristic and responsive only to positive and negative output signals from the shunt feedback amplifier which are not less than a predetermined level in the high gain region of the amplifier to switch to said first and second states respectively.

6. A variable gain circuit comprising a high gain transistor amplifier, and a shunt feedback circuit for said amplifier including a pair of capacitors and a pair of oppositely poled diodes connected in series, means normally forward biasing the diodes to low impedance regions to set the feedback circuit impedance at a low value providing substantial negative feedback, thereby setting the gain of the amplifier at a low value, said diodes responsive to each input current level at a selected minimum value for increasing the impedance of one of the diodes to a high impedance region substantially interrupting the negative feedback to increase the amplifier gain to a high value, and at least two additional diodes, each connected in parallel with and/or opposite polarity to a respective one of the first-mentioned diodes and responsive to each input current level at and above a value which is a predetermined amount greater than said selected minimum value for reducing the impedance of one of the additional diodes to a low value substantially increasing the negative feedback to reduce the gain of the amplifier to a low value.

7. In apparatus of the type wherein means are provided for receiving signals representative of data and noise, wherein the difference between the minimum amplitude of the data signals and the amplitude of a significant amount of noise signals is a small fraction of the minimum data signal amplitude and wherein maximum data signal amplitudes are a large multiple of the minimum data signal amplitudes:

the combination with said means of a threshold detector circuit for discriminating between the data signals and the noise signals, said circuit comprising:

a high gain transistor amplifier receiving said signals, and a shunt feedback circuit for said amplifier including a pair of capacitors and a pair of oppositely poled diodes connected in series, means normally forward biasing the diodes to low impedance regions to set the feedback circuit impedance at a low value providing substantial negative feedback, thereby setting the gain of the amplifier at a minimum value, said diodes responsive to each input signal current level at a predetermined threshold level for increasing the impedance of one of the diodes to a high impedance region substantially interrupting the negative feedback to increase the amplifier gain substantially to its maximum value, two pairs of series-connected additional diodes, each pair connected in parallel with and of opposite polarity to a respective one of the first-mentioned diodes and responsive to each input signal current level at a value which is twice the value of said threshold level for reducing the impedance of one of the additional diodes to a low value substantially increasing the negative feedback to reduce the gain of the amplifier to a minimum value.

8. A variable gain circuit comprising a high gain transistor amplifier, and a shunt feedback circuit for said amplifier including a pair of capacitors and a pair of oppositely poled Zener diodes connected in series:

means normally biasing the diodes to low impedance regions to set the feedback circuit impedance at a low value producing substantial negative feedback, thereby setting the gain of the amplifier at a minimum value, and said diodes responsive to each input current level at a threshold level for increasing the impedance of one of the diodes to a high impedance region substantially interrupting the negative feedback to increase the amplifier gain substantially to its maximum value and responsive to each input current level which exceeds the threshold level by at least a predetermined amount for again decreasing the diode impedance to a low impedance region substantially increasing the negative feedback to decrease the amplifier gain.